United States Patent
Zhang et al.

(10) Patent No.: US 6,673,387 B1
(45) Date of Patent: Jan. 6, 2004

(54) CONTROL OF OXIDE LAYER REACTION RATES

(75) Inventors: Wei Zhang, Shrewsbury, MA (US); Qi Li, Marlborough, MA (US); Martin W. Rupich, Framingham, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/616,566

(22) Filed: Jul. 14, 2000

(51) Int. Cl.[7] .......................... B05D 5/12; H01L 39/24; C23C 18/12
(52) U.S. Cl. ................... 427/62; 427/126.3; 427/372.2; 427/377; 427/380; 505/123; 505/310; 505/470; 505/742
(58) Field of Search .................. 427/62, 372.2, 427/377, 380, 126.3; 505/300, 470, 742, 123

(56) References Cited

U.S. PATENT DOCUMENTS

| | | | |
|---|---|---|---|
| 3,763,552 A | 10/1973 | Brown et al. | |
| 3,985,281 A | 10/1976 | Diepers et al. | 228/148 |
| 4,859,652 A | 8/1989 | Block | 505/1 |
| 4,882,312 A | * 11/1989 | Mogro-Campero et al. | 427/126.3 |

(List continued on next page.)

FOREIGN PATENT DOCUMENTS

| | | |
|---|---|---|
| EP | 0 308 869 A2 | 3/1989 |
| EP | 0 387 525 A1 | 9/1990 |
| EP | 0 431 782 A1 | 6/1991 |
| EP | 0 506 528 A2 | 9/1992 |
| EP | 0 584 410 A1 | 3/1994 |
| EP | 0 872 579 A1 | 10/1998 |
| WO | WO 92/05591 | 4/1992 |
| WO | WO 97/05669 | 2/1997 |
| WO | 58415 | * 12/1998 |
| WO | WO 98/58415 | 12/1998 |
| WO | WO 99/16941 | 4/1999 |
| WO | WO 99/17307 | 4/1999 |
| WO | WO 99/25908 | 5/1999 |
| WO | WO 99/35083 | 7/1999 |
| WO | WO 02/98076 A1 | 12/2001 |

OTHER PUBLICATIONS

Tanaka et al., "Improvement of $YBa_2Cu_3O_x$ Single–Crystal Surface by Chemical Etching", Jpn. J. App. Phys. vol. 38 (1999) pp L731–L733, Part 2, No. 7A, Jul. 1, 1999.

Koster et al., "flInfluence of the surface treatment on the homoepitaxial growth of $SrTioO_3$", Materials Science and Engineering B56 (1998) 209–212.

McIntyre et al., "Effect of growth conditions on the properties and morphology of chemically derived epitaxial thin films of $Ba_2Ycu_3O_{7-x}$ on (001) $LaAlO_3$", J. Appl. Phys. 71 (4), Feb. 15, 1992, pp 1868—1877.

(List continued on next page.)

Primary Examiner—Brian K. Talbot
(74) Attorney, Agent, or Firm—Fish & Richardson P.C.

(57) ABSTRACT

A process is described for formation of oxide films independent of thickness from precursor films comprising metals, metal oxides, and metal fluorides with properties and structures similar to those previously only obtained in thin films, for example less than about 0.4 microns.

47 Claims, 2 Drawing Sheets

U.S. PATENT DOCUMENTS

| | | | |
|---|---|---|---|
| 4,956,340 A | 9/1990 | Kimura et al. | 505/1 |
| 4,959,347 A | 9/1990 | Kobayashi et al. | 505/1 |
| 4,994,433 A | 2/1991 | Chiang | 505/1 |
| 4,994,435 A | 2/1991 | Shiga et al. | 505/1 |
| 5,038,127 A | 8/1991 | Dersch | 335/216 |
| 5,071,828 A | 12/1991 | Greuter et al. | 505/1 |
| 5,073,537 A | 12/1991 | Hung et al. | 505/1 |
| 5,229,358 A | 7/1993 | Kumar | 505/1 |
| 5,231,074 A | 7/1993 | Cima et al. | 505/1 |
| 5,236,890 A | 8/1993 | Murakami et al. | 505/1 |
| 5,304,533 A | 4/1994 | Kobayashi et al. | 505/440 |
| 5,427,055 A | 6/1995 | Ichikawa | 117/92 |
| 5,449,659 A | 9/1995 | Garrison et al. | 505/330 |
| 5,484,766 A | 1/1996 | Shah et al. | 505/441 |
| 5,571,603 A | 11/1996 | Utumi et al. | 428/212 |
| 5,728,214 A | 3/1998 | Konishi et al. | 117/94 |
| 5,741,377 A | 4/1998 | Goyal et al. | 148/512 |
| 5,866,252 A | 2/1999 | de Rochemont et al. | 428/373 |
| 5,958,599 A | 9/1999 | Goyal et al. | 428/457 |
| 5,964,966 A | 10/1999 | Goyal et al. | 148/426 |
| 5,968,877 A | 10/1999 | Budai et al. | 505/237 |
| 5,981,445 A | 11/1999 | Kirchnerova et al. | 505/440 |
| 6,022,832 A * | 2/2000 | Fritzemeier et al. | 117/102 |
| 6,027,564 A | 2/2000 | Fritzemeier et al. | |
| 6,077,344 A | 6/2000 | Shoup et al. | 117/9 |
| 6,172,009 B1 | 1/2001 | Smith et al. | 505/473 |
| 6,256,521 B1 | 7/2001 | Lee et al. | 505/230 |

OTHER PUBLICATIONS

"Fabrication of High Temperature Superconducting Films Using Perfluoro–Organometallic Precursors", IMB Technical Disclosure Bulletin, vol. 32, No. 5B, oct. 1989, p 241.

U.S. patent application Ser. No. 09/617,520, Lu et al., filed Jul. 14, 2000.

U.S. patent application Ser. No. 09/616,570, Fritzemeier et al., filed Jul. 14, 2000.

U.S. patent application Ser. No. 09/500,717, Fritzemeier et al., filed Feb. 9, 2000.

U.S. patent application Ser. No. 09/500,718, Malozemoff et al., filed Feb. 9, 2000.

U.S. patent applicaiton Ser. No. 09/615,669, Buczek et al., filed Jul. 14, 2000.

U.S. patent application Ser. No. 09/617,518, Fritzemeier, filed Jul. 14, 2000.

U.S. patent application Ser. No. 09/500,701, Buczek et al., filed Feb. 9, 2000.

U.S. patent application Ser. No. 09/579,193, Malozemoff et al., filed May 26, 2000.

Apicella et al., "The Effects of Surface Contamination On The Biaxially Textured Substrate For YBCO Thick Film Deposition", International Journal of Modern Physics B, vol. 13, Nos. 9 & 10 (1999) pp 997–1004.

McIntyre et al, "Epitaxial nucleation and growth of chemically derived $Ba_2Ycu_3O_{7-x}$ thin films on (001) $SrTiO_3$", Journal of Applied Physics, 77 (1995) May 15, No. 10, pp 5263–5272.

He et al., "Deposition of biaxially–oriented metal and oxide buffer–layer films on textured Ni tapes: new substrates for high current, high–temperature superconductors", Physica C, 275 (1997) 155–161.

Boffa et al., "Laser–ablation deposition of $CeO_2$ thin films on biaxially textured nickel substrates", Physica C 312 (1999) 202–212.

He et al., "Growth of biaxially oriented conductive $LaNiO_3$ buffer layers on textured Ni tapes for high–Tc–coated conductors", Physica C 314 (1999) 105–111.

Sheth et al., "Bench Scale Evaluation of Batch Mode Dip–Coating of Sol–Gel $LaAlO_3$ Buffer Material", IEEE Transactions On Applied Superconductivity, vol. 9, No. 2, Jun. 1999, pp 1514–1518.

Smith et al., "High Critical Current Density Thick MOD-–Derived YBCO Films", IEEE Transactions On Applied Superconductivity, vol. 9, No. 2, Jun. 1999, pp. 1531–1534.

Beach et al., "Sol–GEL Synthesis Of Rare Earth Aluminate Films As Buffer Layers For High Tc Superconducting Films", Mat. Res. Soc. Symp. Proc. vol. 495, 195, pp 263–270

Lee et al., "Alternative Buffer Architectures for High Critical Current Density YBCO Superconducting Deposits on Rolling Assisted Biaxially–Textured Substrates", Jpn. J. Appl. Phys. vol. 38 (1999) Pt. 2, No. 2B, pp 178–180.

Paranthaman et al., Growth of biaxially textured $RE_2O_3$ buffer layers on rolled–Ni substrates using reactive evaporation for HTS–coated conductors, Supercond. Sci. Technol. 12(1999) 315–315, Printed in the UK.

Rupich et al., "Growth and Characterization of Oxide Buffer Layers for YBCO Coated Conductors", IEEE Transactions On Applied Superconductivity, vol. 9, No. 2, Jun. 1999, pp 1527–1530.

Shoup et al., "Epitaxial Thin Film Growth of Lanthanum and Neodymium Aluminate Films on Roll–Textured Nickel Using a Sol–Gel Method", Journal of the American Ceramic Society, vol. 81, No. 11, Nov. 1998, pp–3019–3021.

"Dry Etching for VLSI Fabrication", vol. 1, eds. S. Wolf and R.N. Tamber, Lattice Press, Sunset Park, CA pp 539–574 (1986).

Moore et al., "Sol–Gel Processing of $Y_1Ba_2Cu_3O_{7-x}$ Using Alkoxide Precursors: Two Systems Yielding High Degrees of Thin Film Orientation and Crystal Growth", Materials Letters, Vol 7, No. 12, Mar. 1989, pp 415–424.

Rupich et al., "Synthesis of Superconductors from soluble metal oxo alkoxide precursors", J. Mater. Res., vol. 8, No. 7, Jul. 1993, pp 1487–1496.

* cited by examiner

CONTROL OF OXIDE LAYER REACTION RATES

TECHNICAL FIELD

This invention relates to high temperature superconductors (HTS), and more particularly to superconducting layers and methods of making superconducting layers.

BACKGROUND

Coated conductors, comprising a single or multiple combinations of a biaxially textured high temperature superconductor ("HTS") layer on a thin buffer layer and a substrate tape, are a cost-performance-effective technology for manufacturing long length flexible HTS wire for magnet, coil and power applications. For example, these conductors should be useful for power transmission cables, rotor coils of motors and generators, and windings of transformers, as well as for magnets for medical magnetic resonance imaging (MRI), magnetic separation, ion-beam steering and magnetic levitation. Particularly of interest here are applications that use alternating current (ac) currents and fields, or fast ramps of current and field, for example ac power transmission cables, transformers, faultcurrent limiters, magnetic separation magnets and high-energy physics magnets.

Some background on biaxially textured high temperature superconducting "coated conductors" is known. Such coated conductors include at least, for example, a substrate and a superconducting layer (such as YBCO; $YBa_2Cu_3O_x$, or Yttrium-Barium-Copper-Oxide) deposited thereon. One or more buffer layers may be included between the substrate and the superconductor material. An advantage of such materials as YBCO films is the very high critical current densities attainable, particularly in magnetic fields. Other related superconducting materials that can be used are (RE)BCO ($REBa_2Cu_3O_x$, where the Y has been partially or completely replaced by rare earth elements, RE). As information as to the requirements for commercial application, and limitations on conductor technology has become available, the potential for low production costs of these rare-earth superconducting materials (including YBCO) has also become of interest in further development.

Certain challenges in this field include the need for cost effective methods for producing chemically compatible biaxially textured buffer layers, as well as the need to deposit sufficient thickness of the high critical current density superconducting layer. Regarding the first objective, it appears that deformation textured substrates with epitaxial buffer layers can be made cost effective. In addition, ion beam assisted deposition of thin MgO layers with epitaxial top layers may prove to be economically viable.

Regarding the need to deposit thick layers of superconductor precursor compositions, a number of techniques have been evaluated. Chemical vapor deposition (CVD) is not considered a competitive method at this time, due to the very high cost of precursor materials. Most physical vapor deposition (PVD) methods, (for example, pulsed laser ablation, reactive sputtering and electron beam evaporation) are limited by deposition rate, compositional control, and high capital costs. A possible economical PVD method would be thermal or electron beam evaporation of the rare earth elements, copper and barium fluoride, known as the "barium fluoride" process. This process appears to be more rapid than direct PVD methods, but capital costs and control system costs are still likely to be too high. Additionally, the deposited precursor composition must subsequently be reacted in a separate furnace system to form the HTS film.

Solution deposition methods have been evaluated, and these appear to offer much lower costs, since vacuum systems are eliminated. Thus, capital costs are not as high, and deposition rates not as low, as other methods using vacuum systems. Trifluoroacetate (TFA) solution processes offer low costs for precursor compositions, high deposition rate, and non-vacuum processing advantages.

For commercial processes, it is desirable to have a process, which can be used to produce high quality oxide layers at a high rate, to produce a desired film thickness, and a film with high critical current density for superconducting applications.

SUMMARY

The invention provides a process for fabricating dense, highly textured metal oxide films from precursor films containing metals or metal oxides and metal halides. The final thicknesses of such films are preferably between about 1 micron and about 5 microns. The specific superconductors of interest are high temperature superconductors of the class of rare-earth barium cuprate species (REBCO), including, for example, $YBa_2Cu_3O_{7-x}$ (YBCO), and other known superconducting materials, including versions doped with other species. Of particular interest are those materials having superconducting transition temperatures, $T_c$, above about 77 K. The most useful buffered substrates for such films are biaxially textured, providing an epitaxial growth template for achieving maximum attainable critical current densities ($J_c$).

The process can be used for the formation of superconducting films on both single crystal substrates (such as $SrTiO_3$, $LiAlO_3$, and the like), and composite substrates comprising a metal or metal alloy with a chemically and structurally compatible buffer layer (for example, $Ni/CeO_2/$ $YSZ/CeO_2$, and similar structures). The process is applicable to batch processing of individual samples or continuous processing of continuous lengths of material (that is, continuous lengths of wire or tape). A key aspect is the ability to grow thick superconducting films with the same dense microstructure, crystalline texture and current density as previously obtained in thin films, that is, films of thickness less than 0.4 micrometers.

In one aspect, the invention provides a method for forming an oxide layer. The method includes disposing an oxide layer precursor on a surface of a first layer (e.g., a substrate, such as a biaxially textured metal or metal alloy, such as a face centered cubic metal or metal alloy, such as a nickel-containing alloy) at ambient temperature; increasing the ambient temperature to a process temperature; and treating the precursor for a time and under formation conditions sufficient to form the oxide layer, where the formation of the oxide layer is substantially inhibited until the ambient temperature reaches the process temperature. The inhibition of oxide layer formation can be by modulating the rate of introducing a reactant to the first layer, and modulating the rate of removing a product from the first layer. The rate of reactant introduction and product removal can be by modulating the flow rate of a process gas flowing proximate to the surface. For example, the flow rate of the process gas can be lower before the ambient temperature reaches the process temperature (for example, from about 600 to about 850° C., or from about 650 to about 850° C., or from about 700 to about 800° C.) than it is after the ambient temperature reaches the process temperature. The precursor can react with a gaseous reactant to form the oxide layer, and the formation of an oxide layer can proceed with the generation of a gaseous product. The precursor can include soluble compounds of a first metal (for example, a copper compound, such as copper oxide), a second metal (for example, an alkaline earth metal, such as barium fluoride) and a rare earth metal. The oxide layer can have a superconducting transition temperature of more than about 77K, and the oxide layer can form a film having a thickness of at least about 0.6 microns, and the oxide layer can have a critical current density of at least about $5 \times 10^5$ A/cm$^2$. The first layer can further include a buffer layer disposed on the substrate, which can include at least one layer of a metal oxide (such as cerium oxide, or a further layer of yttria-stabilized zirconia). The process gas can include water vapor (which can have a partial pressure of from about 5 to about 150 Torr, or from about 5 to about 100 Torr, or from about 10 to about 50 Torr, or from about 15 to about 20 Torr at ambient temperature) and oxygen (which can have a partial pressure of from about 5 mTorr to about 8000 mTorr, or from about 5 to about 800 mTorr, or from about 5 to about 200 mTorr, or from about 5 to about 100 mTorr, or from about 50 to about 100 mTorr in 1 atmosphere total process gas pressure).

In a further aspect, the invention provides a coated conductor article made by the methods disclosed herein.

As used herein, "biaxially textured" refers to a surface for which the crystal grains are in close alignment with a direction in the plane of the surface. One type of biaxially textured surface is a cube-textured surface, in which the crystal grains are also in close alignment with a direction perpendicular to the surface. Examples of cube-textured surfaces include (100)[001] and (100)[011] surfaces, and an example of a biaxially textured surface is the (113)[211] surface. As used herein, "epitaxial layer" refers to a layer of material, the crystallographic orientation of which is directly related to the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is directly related to the crystallographic orientation of the substrate. Thus, in addition to the above-discussed properties of a substrate, it can also be desirable for a substrate to have a biaxially textured surface or a cube textured surface. Texturing in HTS films has been demonstrated by epitaxial growth of the superconductor on appropriate templates. Early work used single crystal oxide substrates as the HTS growth template. For many practical applications, the substrate must be flexible. A well-oriented template can be achieved by means of ion beam assisted deposition (IBAD) of oxide buffer layers on random polycrystalline metal substrates. High quality epitaxial superconducting films have been grown on such tapes. In alternative and preferred embodiments, texturing in substrates can be induced using the deformation texturing ("DeTex") process (as set forth hereinbelow) and epitaxial deposition of buffer layer(s) and subsequent functional layer(s) can be accomplished as also described hereinbelow.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

DESCRIPTION OF DRAWINGS

Like reference symbols in the various drawings indicate like elements.

DETAILED DESCRIPTION

The invention results from the discovery that relatively high critical current densities can be achieved in high temperature superconductors (HTS) made using processes in which the nucleation of a-axis oriented oxide layer grains is minimized, by inhibiting the formation of the oxide layer until the required reaction conditions are attained.

The formation of (RE)Ba$_2$Cu$_3$O$_{7-x}$ films from halide-containing precursors is a multi-step process that requires the introduction of H$_2$O into the film as a reactant, and the removal of HF from the film as a product, as shown in Eq. 1

(Eq. 1)

The reaction rate constant for the first step is $k_1$, and that for the second step is $k_2$. At typical conditions for the decomposition of oxide layer precursors to give the oxide layer, $k_2 > k_1$. Thus, the overall reaction rate is determined by the formation rate of, for example, BaO, which depends on the following equilibrium:

This equilibrium is determined by the introduction of H$_2$O into the film and the removal of HF from the film.

Figure 1:
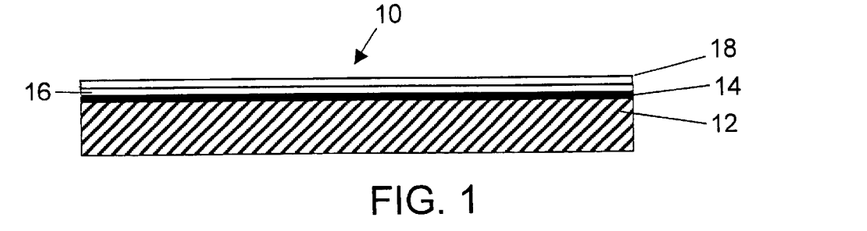
FIGS. 1–3 are alternate configurations for high temperature superconductor coated conductors.
Figure 2:
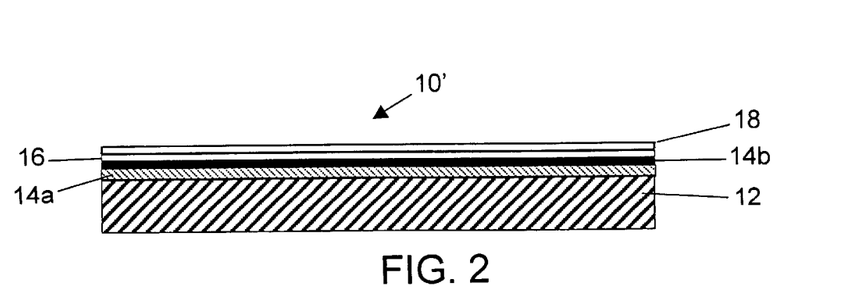
Figure 3:
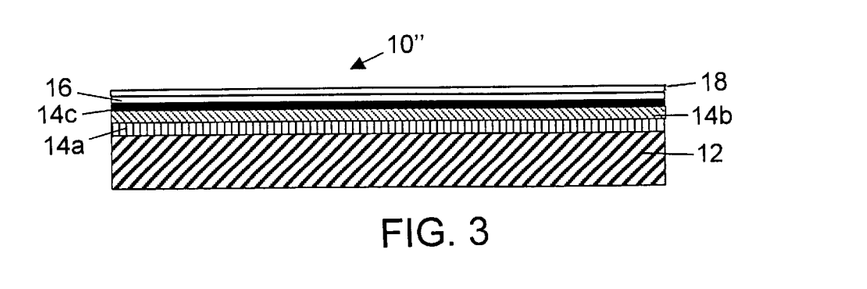

Referring to FIGS. 1–3, various embodiments for HTS coated conductors are shown. Referring to FIG. 1, high temperature superconductor (HTS) articles such as 10, particularly in the form of wires or tapes, generally comprise a substrate 12, at least one buffer coating 14, a superconducting layer 16 (formed of, for example, YBCO, (RE)BCO), and a cap layer 18. Layer 14 can be formed of any material capable of supporting layer 16. For example, layer 14 can be formed of a buffer layer material. Examples of buffer layer materials include metals and metal oxides, such as silver, nickel, TbO$_x$, GaO$_x$, CeO$_2$, yttria-stabilized zirconia (YSZ), Y$_2$O$_3$, LaAlO$_3$, SrTiO$_3$, LaNiO$_3$, Gd$_2$O$_3$, LaCuO$_3$, SrRuO$_3$, NdGaO$_3$, NdAlO$_3$ and nitrides as known in the art. A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

Any of the embodiments can further include a cap layer 18. Cap layer 18 can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, cap layer 18 can include a second layer of normal metal (for example, copper or aluminum or alloys of normal metals.

The substrate can be formed of alloys having one or more surfaces that are biaxially textured (e.g., (113)[211]) or cube textured (e.g., (100)[001] or (100)[011]). The alloys can have a relatively low Curie temperature (e.g., at most about 80K, at most about 40K, or at most about 20K).

In certain embodiments, the substrate is a binary alloy that contains two of the following metals: copper, nickel, chromium, vanadium, aluminum, silver, iron, palladium, molybdenum, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). A binary alloy can further include relatively small amounts of impurities (e.g., less than about 0.1 atomic percent of impurities, less than about 0.01 atomic percent of impurities, or less than about 0.005 atomic percent of impurities).

In some embodiments, the substrate contains more than two metals (e.g., a ternary alloy or a quarternary alloy). In these embodiments the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of impurities (e.g., less than about 0.1 atomic percent of impurities, less than about 0.01 atomic percent of impurities, or less than about 0.005 atomic percent of impurities).

An alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

These methods are described in commonly owned U.S. Patent Application No. 09/283,775, filed Mar. 31, 1999, and entitled "Alloy Materials;" commonly owned U.S. patent application Ser. No. 09/283,777, filed Mar. 31, 1999, and entitled "Alloy Materials;" PCT Publication No. WO 99/17307, published on Apr. 8, 1999, and entitled "Substrates with Improved Oxidation Resistance;" and PCT Publication No. WO 99/16941, published on Apr. 8, 1999, and entitled "Substrates for Superconductors," all of which are hereby incorporated by reference.

In some embodiments, a buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 400° C. (e.g., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

These methods are described in PCT Publication No. WO 99/25908, published on May 27, 1999, and entitled "Thin Films Having A Rock-Salt-Like Structure Deposited on Amorphous Surfaces," which is hereby incorporated by reference.

In some embodiments, stable oxide formation can be mitigated until a first epitaxial (for example, buffer) layer is formed on the biaxially textured alloy surface, using an intermediate layer disposed on the surface of the substrate. Intermediate layers suitable for use in the present invention include those epitaxial metal or alloy layers that do not form surface oxides when exposed to conditions as established by $P_{O2}$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide (s) at the substrate surface which could significantly impede the deposition of epitaxial layers due to, for example, lack of texture in this oxide layer.

In some embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Impurities or alloys may include alloys of nickel and/or copper. Epitaxial films or layers deposited on an intermediate layer can include metal oxides, chalcogenides, halides, and nitrides. In preferred embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electrochemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, the formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

This heating step can be carried out after, or concurrently with, the drying of excess solvent from the sol gel precursor film. It must be carried out prior to decomposition of the precursor film, however.

The carbon contamination accompanying conventional oxide film preparation in a reducing environment (e.g., 4% $H_2$-Ar) is believed to be the result of an incomplete removal of the organic components of the precursor film. The presence of carbon-containing contaminants $C_xH_y$ and $C_aH_bO_c$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the precursor solution can be air dried, and then heated in an initial decomposition step. Alternatively, the precursor solution can be directly heated in an initial decomposition step, under an atmosphere that is reducing relative to the metal substrate. Once the oxide layer initially nucleates on the metal substrate in the desired epitaxial orientation, the oxygen level of the process gas is increased, for example, by adding water vapor or oxygen. The nucleation step requires from about 5 minutes to about 30 minutes to take place under typical conditions.

These methods are described in U.S. patent application Ser. No. 09/617,520, filed on even date herewith now abandoned, and entitled "Enhanced Purity Oxide Layer Formation," which is hereby incorporated by reference.

In certain embodiments, an epitaxial buffer layer can be formed using a low vacuum vapor deposition process (e.g., a process performed at a pressure of at least about $1 \times 10^{-3}$ Torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1 \times 10^{-3}$ Torr, such as less than about $1 \times 10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1 \times 10^{-3}$ Torr, at least about 0.1 Torr, or at least about 1 Torr) at a surface temperature below the temperature used to grow the epitaxial layer using physical vapor deposition at a high vacuum (e.g., at most about $1 \times 10^{-4}$ Torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832, issued Feb. 8, 2000, and entitled "Low Vacuum Process for Producing Superconductor Articles with Epitaxial Layers;" and/or commonly owned U.S. patent application Ser. No. 09/007,372, filed Jan. 15, 1998, and entitled "Low Vacuum Process for Producing Epitaxial Layers of Semiconductor Material," all of which are hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate tape or wire is made negative with respect to the anode potential, it will be subjected to a steady bombardment by ions from the gas prior to the deposition (if the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substsntially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000 abandoned, and entitled "Oxide Layer Method," and commonly owned U.S. patent application Ser. No. 09/615,669, filed on even date herewith, and entitled "Oxide Layer Method now abandoned," both of which are hereby incorporated by reference in their entirety.

In preferred embodiments, three buffer layers are used. A layer of $Y_2O_3$ or $CeO_2$ (e.g., from about 20 nanometers to about 50 nanometers thick) is deposited (e.g., using electron beam evaporation) onto the substrate surface. A layer of YSZ (e.g., from about 0.2 micron to about 1 micron thick, such as about 0.5 micron thick) is deposited onto the surface of the $Y_2O_3$ or $CeO_2$ layer using sputtering (e.g, using magnetron sputtering). A $CeO_2$ layer (e.g., about 20 nanometers thick) is deposited (e.g, using magnetron sputttering) onto the YSZ surface. The surface of one or more of these layers can be chemically and/or thermally conditioned as described herein.

In certain embodiments, the underlying layer (e.g., a buffer layer or a different superconductor layer) can be conditioned (e.g., thermally conditioned and/or chemically conditioned) so that the superconductor layer is formed on a conditioned surface. The conditioned surface of the underlying layer can be biaxially textured (e.g., (113)[211]) or cube textured (e.g., (100)[011] or (100)[011]), have peaks in an X-ray diffraction pole figure that have a full width at half maximum of less than about 20° (e.g., less than about 15°, less than about 10°, or from about 5° to about 10°), be smoother than before conditioning as determined by high resolution scanning electron microscopy or atomic force microscopy, have a relatively high density, have a relatively low density of impurities, exhibit enhanced adhesion to other material layers (e.g., a superconductor layer or a buffer layer) and/or exhibit a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature with or without chemical conditioning to affect changes in the surface of a material layer, such as a buffer layer or a superconductor material layer, so that the resulting surface exhibits one or more of the above noted properties. Preferably, thermal conditioning occurs in a controlled environment (e.g., controlled gas pressure, controlled gas environment and/or controlled temperature).

Thermal conditioning can include heating the surface of the underlying layer to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be performed under a variety of pressure conditions, such as above atmospheric pressure, below atmospheric pressure, or at atmospheric pressure. Thermal conditioning can also be performed using a variety of gas environments (e.g., an oxidizing gas environment, a reducing gas environment, or an inert gas environment).

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as $BF_3$ and/or $CF_4$). Chemical conditioning techniques are disclosed, for example, in *Silicon Processing for the VLSI Era*, Vol. 1, eds. S. Wolf and R. N. Tanber, pp. 539–574, Lattice Press, Sunset Park, Calif., 1986.

Alternatively or additionally, chemical conditioning can involve solution phase techniques, such as disclosed in *Metallurgy and Metallurgical Engineering Series*, 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

This method can be used to form multiple buffer layers (e.g., two, three, four, or more buffer layers), with one or more of the buffer layers having a conditioned surface.

The method can also be used to form multiple superconductor layers, with one or more of the superconductor layers having a conditioned surface. For example, a superconductor layer can be formed and then thermally and/or chemically conditioned as described above. An additional superconductor layer can then be formed on the conditioned surface of the first superconductor layer. This process can be repeated as many times as desired.

These methods are described in commonly owned U.S. Provisional Patent Application No. 60/166,140, filed Nov. 18, 1999, and entitled "Multi-Layer Articles and Methods of Making Same," and commonly-owned U.S. patent application Ser. No. 09/615,999, filed on even date herewith still pending, and entitled "Multi-layer Articles and Methods of Making Same," both of which are hereby incorporated by reference.

In certain embodiments, the superconductor layer can be formed from a precursor composition that has a relatively small amount of free acid. In aqueous solutions, this can correspond to a precursor composition with a relatively neutral pH (e.g., neither strongly acidic nor strongly basic). The precursor composition can be used to prepare multi-layer superconductors using a wide variety of materials that can be used as the underlying layer on which the superconductor layer is formed.

The total free acid concentration of the precursor composition can be less than about $1\times10^{-3}$ molar (e.g., less than about $1\times10^{-5}$ molar or about $1\times10^{-7}$ molar). Examples of free acids that can be contained in a precursor composition include trifluoroacetic acid, acetic acid, nitric acid, sulfuric acid, acids of iodides, acids of bromides and acids of sulfates.

When the precursor composition contains water, the precursor composition can have a pH of at least about 3 (e.g., at least about 5 or about 7).

In some embodiments, the precursor composition can have a relatively low water content (e.g., less than about 50 volume percent water, less than about 35 volume percent water, less than about 25 volume percent water).

In embodiments in which the precursor composition contains trifluoroacetic acid and an alkaline earth metal (e.g., barium), the total amount of trifluoroacetic acid can be selected so that the mole ratio of fluorine contained in the precursor composition (e.g., in the form of trifluoroacetate) to the alkaline earth metal (e.g., barium ions) contained in the precursor composition is at least about 2:1 (e.g., from about 2:1 to about 18.5:1, or from about 2:1 to about 10:1).

Superconducting articles formed from such precursor compositions can include more than one superconductor layer (e.g., two superconductor layers disposed on each other). The combined thickness of the superconductor layers can be at least about one micron (e.g., at least about two microns, at least about three microns, at least about four microns, at least about five microns, or at least about six microns). The combined critical current density of the superconductor layers can be at least about $5 \times 10^5$ Amperes per square centimeter (e.g., at least about $1 \times 10^6$ Amperes per square centimeter, or at least about $2 \times 10^6$ Amperes per square centimeter).

In general, the precursor compositions can be prepared by combining soluble compounds of a first metal (e.g., copper), a second metal (e.g., an alkaline earth metal), and a rare earth metal with one or more desired solvents and optionally water. As used herein, "soluble compounds" of the first, second and rare earth metals refer to compounds of these metals that are capable of dissolving in the solvent(s) contained in the precursor compositions. Such compounds include, for example, salts (e.g., nitrates, acetates, alkoxides, iodides, sulfates and trifluoroacetates), oxides and hydroxides of these metals.

These methods and compositions are described in commonly owned U.S. Provisional Patent Application Ser. No. 60/166,297, filed on Nov. 18, 1999, and entitled "Superconductor Articles and Compositions and Methods for Making Same," and commonly owned U.S. patent application Ser. No. 09/616,810, filed on even date herewith still pending, and entitled "Superconductor Articles and Compositions and Methods for Making Same," both of which are hereby incorporated by reference.

In certain embodiments, a precursor solution is formed of an organic solution containing metal trifluoroacetates prepared from powders of $BaCO_3$, $YCO_3 \cdot 3H_2O$ and $Cu(OH)_2CO_3$ combined and reacted using methods known to those skilled in the art. For example, the powders can be combined in a 2:1:3 ratio with between 20–30% (5.5–6.0 M) excess trifluoroacetic acid in methyl alcohol and then refluxed (e.g., for approximately four to ten hours) to produce a solution substantially 0.94 M based on copper content.

The precursor solution is then applied to a surface (e.g., a buffer layer surface), such as by spin coating or other techniques known to those skilled in the art.

After application to the surface (e.g, the buffer layer surface), the precursor solution is heat treated. Generally, the solution is heated at a rate of from about 0.5° C. per minute to about 10° C. per minute in moist oxygen (e.g., having a dew point in the range of from about 20° C. to about 75° C.) to a temperature in the range of from about 300° C. to about 500° C. The coating is then heated for about one hour to a temperature of less than about 860° C. (e.g., less than about 810° C.) in a moist reducing nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating is subsequently heated to a temperature of from about 400° C. to about 500° C. for at least about eight hours at in dry oxygen. The coating can then be cooled to room temperature in static dry oxygen.

These methods are described in U.S. Pat. No. 5,231,074, issued on Jul. 27, 1993, and entitled "Preparation of Highly Textured Oxide Superconducting Films from MOD Precursor Solutions," which is hereby incorporated by reference.

In some embodiments, a metal oxyfluoride is deposited using one or more standard techniques, such as metalorganic solution deposition, metalorganic chemical vapor deposition, reactive evaporation, plasma spray, molecular beam epitaxy, laser ablation, ion beam sputtering, electron beam evaporation, depositing a metal trifluoroacetate coating and decomposing the coating as described herein. Multiple layers of metal oxyfluoride may be deposited.

Other constituent metallic elements of the desired oxide superconductor are also deposited in substantially stoichiometric proportions.

The metal oxyfluoride is converted into an oxide superconductor at a rate of conversion selected by adjusting temperature, vapor pressure of gaseous water or both. For example, the metal oxyfluoride can be converted in a processing gas having a moisture content of less than 100% relative humidity (e.g., less than about 95% relative humidity, less than about 50% relative humidity, or less than about 3% relative humidity) at 25° C. to form some oxide superconductor, then completing the conversion using a processing gas having a higher moisture content (e.g., from about 95% relative humidity to about 100% relative humidity at 25° C.). The temperature for converting the metal oxyfluoride can be in the range of from about 700° C. to about 900° C. (e.g., from about 700° C. to about 835° C.). The processing gas preferably contains from about I volume percent oxygen gas to about 10 volume percent oxygen gas.

These methods are described in PCT Publication No. WO 98/58415, published on Dec. 23, 1998, and entitled "Controlled Conversion of Metal Oxyfluorides into Superconducting Oxides," which is hereby incorporated by reference.

In certain embodiments, the preparation of the superconductor layer includes using a precursor composition containing a trifluoroacetate salt of one or more metals and a controlled total water content (e.g., controlled content of liquid water in the precursor composition and controlled content of water vapor in the surrounding environment) present when treating the precursor composition to form an intermediate of the superconductor layer (e.g., a metal oxyfluoride intermediate of the superconductor layer). For example, the precursor composition can have a relatively low water content (e.g., less than about 50 volume percent water, less than about 35 volume percent water, or less than about 25 volume percent water) and/or a relatively high solids content, whereas the surrounding gas environment can have a relatively high vapor pressure of water (e.g., from about 5 Torr to about 50 Torr water, from about 5 Torr to about 30 Torr water, or from about 10 Torr to about 25 Torr water). The superconductor layer intermediate (e.g., metal oxyfluoride intermediate) can be formed in a relatively short period of time (e.g., less than about five hours, less than about three hours, or less than about one hour).

Treating the precursor composition can include heating the precursor composition from an initial temperature (e.g., room temperature) to a temperature of from about 190° C. to about 215° C. (e.g., about 210° C.) at a rate of at least about 5° C. per minute (e.g., at least about 8° C. per minute, or at least about 10° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

Heating is then continued to a temperature of from about 220° C. to about 290° C. (e.g., about 220° C.) at a rate of from about 0.05° C. per minute to about 0.4° C. per minute (e.g., from about 0.1° C. per minute to about 0.4° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form an intermediate of the superconductor material (e.g., a metal oxyfluoride intermediate). The nominal partial pressure of oxygen can be, for example, from about 0.1 Torr to about 760 Torr.

The intermediate can be heated to form the desired superconductor layer. For example, the intermediate can be heated to a temperature of from about 700° C. to about 825° C. in an environment containing from about 0.1 Torr to about 50 Torr oxygen and from about 0.1 Torr to about 150 Torr water vapor (e.g., about 12 Torr water vapor) with the balance being, for example, nitrogen and/or argon.

The method can result in a well-ordered superconductor layer (e.g., biaxially textured or cube textured) having a relatively high critical current density (e.g., at least about $5 \times 10^5$ Aamperes per square centimeter).

These methods are described in commonly owned U.S. Provisional Patent Application Ser. No. 60/166,145, filed on Nov. 18, 1999, and entitled "Methods and Compositions for Making a Multi-Layer Article," and commonly owned U.S. patent application Ser. No. 09/615,991, filed on even date herewith pending, and entitled "Methods and Compositions for Making a Multi-layer Article," both of which are hereby incorporated by reference.

In certain embodiments, a metal oxyfluoride intermediate of a superconductor material can be prepared using a process that involves relatively few temperature ramps (e.g., less than three ramps, such as two ramps).

Alternatively or additionally, forming the metal oxyfluoride can include one or more steps in which the temperature is held substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) after a first temperature ramp to a temperature greater than about room temperature (e.g., at least about 50° C., at least about 100° C., at least about 200° C., at least about 215° C., from about 215° C. to about 225° C., about 220° C.).

Formation of the metal oxyfluoride intermediate can involve using more than one gas environment (e.g., a gas environment having a relatively high water vapor pressure and a gas environment having a relatively low water vapor pressure) while maintaining the temperature substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours). As an example, in a high water vapor pressure environment, the water vapor pressure can be from about 17 Torr to about 40 Torr (e.g., from about 25 Torr to about 38 Torr, such as about 32 Torr). A low water vapor pressure environment can have a water vapor pressure of less than about 1 Torr (e.g., less than about 0.1 Torr, less than about 10 milliTorr, about five milliTorr).

Generally, the metal oxyfluoride is formed by disposing a composition (e.g., a precursor solution) on a surface (e.g., a substrate surface, a buffer layer surface or a superconductor layer surface) and heating the composition. The methods of disposing the composition on the surface include spin coating, dip coating, web coating and other techniques known in the art.

Typically, in an initial decomposition step, the initial temperature in this step is about room temperature, and the final temperature is from about 215° C. to about 225° C. using a temperature ramp of 10° C. per minute or less. During this step, the partial pressure of water vapor in the nominal gas environment is preferably maintained at from about 17 Torr to about 40 Torr. The partial pressure of oxygen in the nominal gas environment can be maintained at from about 0.1 Torr to about 760 Torr. The temperature and nominal gas environment are then held substantially constant for a relatively long period of time.

After this time period, the gas environment is changed to a relatively dry gas environment (e.g., less than about one Torr water vapor, less than about 0.1 Torr water vapor, less than about 10 mTorr water vapor, 5 mTorr water vapor) while maintaining the temperature substantially constant. The temperature and nominal gas environment are then held substantially constant for a relatively long period of time.

After this time period, the nominal gas environment is maintained substantially constant and heating is continued to a temperature sufficient to form the metal oxyfluoride intermediate (e.g., about 400° C.). This step is preferably performed using a temperature ramp of 10° C. per minute or less.

The metal oxyfluoride intermediate can then be heated to form the desired superconductor layer. Typically, this step is performed by heating to a temperature of from about 700° C. to about 825° C. During this step, the nominal gas environment typically can contain from about 0.1 Torr to about 50 Torr oxygen and from about 0.1 Torr to about 150 Torr (e.g., about 12 Torr) of water vapor with the balance being nitrogen and/or argon.

Preferably, the metal oxyfluoride intermediate has a relatively low defect density.

These methods are described in commonly owned U.S. patent application Ser. No. 09/616,811, filed on even date herewith abandoned, and entitled "Methods of Making A Superconductor," which is hereby incorporated by reference.

In certain embodiments, the superconducting layer can be formed from solid-state, or semi solid state, precursor materials deposited in the form of a dispersion. These precursor compositions allow for example the substantial elimination of $BaCO_3$ formation in final YBCO superconducting layers, while also allowing control of film nucleation and growth.

Two general approaches are presented for the formulation of precursor compositions. In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. Analysis of such particles would desirably reveal a rare-earth:barium:copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions. Alternatively, one or more of the cationic constituents can be provided in the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89K, and $J_c$ greater than about 500,000 $A/cm^2$ at a film thickness of 1 micron or greater. For example, for a $YBa_2Cu_3O_{7-x}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Batrifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solublized metalorganic salt containing some or all of the cation constituents, provided at least a portion of one of the compounds containing cation constituents present in solid form. In certain embodiments, the precursor in a dispersion includes a binder and/or a dispersant and/or solvent(s).

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about 1 to 10 microns, preferably from about 1 to 5 microns, more preferably from about 2 to 4 microns.

More details are provided in commonly owned U.S. patent application Ser. No. 09/500,717, filed on Feb. 9, 2000, and entitled "Coated Conductor Thick Film Precursor," which is hereby incorporated by reference in its entirety.

In some embodiments, multi-layer high temperature superconductors are provided, including first and second high temperature superconductor coated elements. Each element includes a substrate, at least one buffer layer deposited on the substrate, a high temperature superconductor layer, and optionally a cap layer. The first and second high temperature superconductor coated elements can be joined at the first and second cap layers, or can be joined with an intervening, preferably metallic, layer. Exemplary joining techniques include soldering and diffusion bonding.

Such a multi-layer architecture provides improved current sharing, lower hysteretic losses under alternating current conditions, enhanced electrical and thermal stability, and improved mechanical properties. Useful conductors can be made having multiple tapes stacked relative to one another and/or laminated to provide sufficient ampacity, dimensional stability, and mechanical strength. Such embodiments also provide a means for splicing coated tape segments and for termination of coated tape stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the cap layer structure.

The cap layer can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, the cap layer can include a second layer of normal metal (for example, copper or aluminum or alloys of normal metals). In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). The cap layer deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the cap layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

In particular embodiments, tensile strain on the superconducting layers can be minimized by providing the superconducting layer within a neutral mechanical axis zone. A "neutral mechanical axis" of a flexible material in the form of a tape of layered materials is a plane in the plane of the tape, coplanar with the layers of the tape, in which tensile strain experienced upon bending the material in a direction normal to the plane is zero. An operational layer centered on this axis will experience minimum tensile strain. A "neutral mechanical axis zone" is a region where the maximum strain experienced by the superconducting layer is less than that which would lead to degraded performance. The criterion for positioning the operational layer within the neutral mechanical axis zone is derived by balancing the moments in bending. This is done by properly specifying the thicknesses, positions, and Young's modulus of the laminate layer or layers; laminate layers are those layers which are non-operational, and can include substrate, buffer and cap layers, for example.

More details are provided in commonly owned U.S. Provisional Patent Application Ser. No. 60/145,468, filed on Jul. 23, 1999, and entitled "Enhanced High Temperature Coated Superconductors," and commonly owned U.S. patent application Ser. No. 09/617,518, filed concurrently herewith allowed no Pat. No. yet, and entitled "Enhanced High Temperature Coated Superconductors," both of which are hereby incorporated by reference in its entirety.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

More details are provided in commonly owned U.S. patent application Ser. No. 09/500,718, filed on Feb. 9, 2000, and entitled "Coated Conductors with Reduced AC Loss," which is hereby incorporated by reference in its entirety.

Typical thermal processes used for the conversion of fluoride-containing precursors to the $(RE)Ba_2Cu_3O_{7-x}$ films include initial conditions, in which the oxide layer precursor materials are at ambient temperature, and under a process gas. The temperature is increased at a rate that can range from about 2° C. to about 20° C. per minute. The temperature increase proceeds until a decomposition temperature is reached, generally from about 600° C. to about 850° C. The process gas is introduced, which includes a mixture of oxygen and/or water vapor, with $PO_2$ of from about 5 mTorr to about 8000 mTorr, or from about 5 to about 800 mTorr, or from about 5 to 200 mTorr, or from about 50 to about 100 mTorr, for example about 76 mTorr, and a $pH_2O$ of from about 5 to about 150 Torr, or from about 5 to about 100 Torr, or from about 10 to about 50 Torr, or from about 15 to about 20 Torr, for example about 17 Torr, in an inert carrier gas, such as nitrogen or argon.

Conventional processes developed for decomposition of fluoride-containing precursors use a constant, and low, non-turbulent flow of process gas that is introduced into the decomposition furnace in an orientation that is parallel to the film surface, resulting in a stable boundary layer at the film/gas interface. The low flow rate remains constant throughout the duration of the decomposition process. Although such conventional processes can be useful for preparing films with thicknesses less than 0.4 microns, they are not generally applicable for creating thick films (for example, greater than 0.6 microns), while maintaining critical current densities ($J_c$) equivalent to those of thin films. The $J_c$ of films prepared by conventional processes decrease significantly as the film thicknesses increase.

In the apparatus typically used for oxide layer precursor decomposition, the diffusion of the gaseous reactants and products through this gas/film boundary layer appears to control the overall reaction rates. In thin, small area films (for example, less than about 0.4 microns thick and less than about a square centimeter), the diffusion of $H_2O$ into the film and the diffusion of HF out of the film occur at rates such that the formation of the $YBa_2Cu_3O_{7-x}$ phase does not begin at any significant rate until the sample reaches the processing temperature. However, as the film thickness or area increases, the rates of gaseous diffusion into and out of the film decrease, all other parameters being equal. This results in longer reaction times and/or incomplete formation of the $YBa_2Cu_3O_{7-x}$ phase, resulting in reduced crystallographic texture, lower density, and reduced critical current density. Thus, the overall rate of $YBa_2Cu_3O_{7-x}$ phase formation is determined, to a significant extent, by the diffusion of gases through the boundary layer at the film surface. The formation and nature of the boundary layer is a function of the gas dynamics through the furnace used to decompose oxide layer precursors, particularly at the film surface. One of our approaches to eliminating these boundary layers is to produce a turbulent flow at the film surface. Under such conditions, the local gas composition at the interface is maintained essentially the same as in the bulk gas (that is, the $pH_2O$ is constant, and the pHF is approximately zero). Thus, the concentration of the gaseous products/reactants in the film is not controlled by the diffusion through the gas/film surface boundary layer condition, but rather by diffusion through the film.

Carrying out the reaction in a system where the boundary layer is disrupted by a turbulent gas flow results in increased reaction rates for the formation of the $YBa_2Cu_3O_{7-x}$ phase. However, the resulting films have a significant percentage of a-axis oriented grains and, subsequently, poor superconducting characteristics (for example, low critical current densities). While not bound by any particular theory of operation, the increased rate of $YBa_2Cu_3O_{7-x}$ phase formation under process conditions including turbulent gas flow appears to result primarily from the increased rate of removal of the reaction product, in this case, HF, from the film. In fact, the product removal is effective enough that a significant amount of $YBa_2Cu_3O_{7-x}$ phase formation takes place during the temperature ramp to the desired processing temperature. Under pre-process conditions (that is, T less than about 725° C., and $pO_2$ approximately 0.001 atmosphere), the $YBa_2Cu_3O_{7-x}$ phase forms with an undesirably high percentage of a-axis oriented grains.

In order to minimize the nucleation of a-axis $YBa_2Cu_3O_{7-x}$ oriented grains on a substrate surface, the formation of the $YBa_2Cu_3O_{7-x}$ phase is inhibited until desired process conditions are reached. For example, the formation of the $YBa_2Cu_3O_{7-x}$ phase can be inhibited until desired process temperature is reached. Inhibition of $YBa_2Cu_3O_{7-x}$ phase formation can be achieved by a number of potential approaches. One approach is to inhibit the formation of BaO at temperatures below the desired $YBa_2Cu_3O_{7-x}$ reaction temperature (that is, from about 600° C. to about 725° C.). This can be carried out by a number of potential processes.

In one embodiment, a combination of: 1) low (non-turbulent) process gas flow, so that a stable boundary layer is established at the film/gas interface, during the ramp to temperature, and 2) high (turbulent) process gas flow, so that the boundary layer is disrupted at the film/gas interface, is employed. For example, in a three inch tube furnace, the flow can be from about 0.5 to about 2.0 L/min during the temperature ramp from ambient temperature to the desired process temperature. Thereafter, the flow can be increased to a value of from about 4 to about 15 L/min during the time at which the film is being processed. The flow rate can be changed once the temperature reaches the reaction temperature by adjusting the flow rate in a stationary furnace or by pulling the tape into a separate gas flow zone in a continuous process furnace. Thus, the rate of formation of $YBa_2Cu_3O_{7-x}$ and epitaxial texture formation can be increased at high temperature, while minimizing the amount of unwanted a-axis nucleation and growth at low temperature during ramp up. According to the processes described herein, a-axis nucleated grains are present in an amount of less than about 5%, as determined by X-ray analysis, and less than about 1%, as determined by scanning electron microscopy.

The invention will be further described in the following examples, which do not limit the scope of the invention described in the claims.

EXAMPLES

The following examples are illustrative of some of the advantages and properties of some embodiments of the invention.

Example 1

Jc and Thickness of Films Prepared with 2 L/minute Flow Rate

Single crystals of YSZ (yttria-stabilized zirconia) were used for deposition of a $CeO_2$ buffer layer by sputtering. The $CeO_2$ layer was approximately 25 nm in thickness. The as-deposited buffer layer was post-annealed in 100% oxygen at 950° C. for one hour.

A TFA (trifluoroacetate) solution was made from acetate precursors. 51.4 grams of $Y(CO_2CH_3)_3.4 H_2O$ was dissolved in 514 grams water, 77.6 grams barium acetate, was dissolved in 388 grams water, and 91 grams copper acetate was dissolved in 1365 grams water. The three solutions were dissolved together. The ratio of Y:Ba:Cu was 1:2:3. Then 243 grams of the solution was mixed with 10 mL of trifluoroacetic acid. The solution was then dried under vacuum at 60° C. The solid was then dissolved in methanol and diluted with methanol to a volume of 50 mL. The TFA solution was coated onto the buffer layer by spin coating, performed by coating the surface of the sample at a spin speed that was ramped from zero to 1000 rpm in 0.5 seconds, holding the spin speed at about 1000 rpm for five seconds, ramping the spin speed to 2000 rpm over 0.5 seconds, and keeping the spin speed at 2000 rpm for 60 seconds.

The sample was then heated to 210° C. at a rate of 10° C./minute in oxygen with a $pH_2O$ of 17 Torr. The gas flow rate was 2 L/min for a tubular furnace with 2.25 inch diameter. A ramp rate of 0.04° C./minute was then used until the temperature reached 220° C., at which time the temperature was ramped to about 400° C. at a rate of about 3° C./minute.

The film was then heat treated to form the superconductor. The total gas pressure of the process gas was 1.0 atmosphere. The flow rate of the gas was 2 L/minute throughout the heat treatment. The film was first heated to 775° C. at a 10° C./minute ramp rate, held at 775° C. for about 3.5 hours in the process gas ($N_2$) containing an oxygen partial pressure of 0.076 Torr (that is, 0.0001 atmosphere $O_2$) and a water vapor partial pressure of about 17 Torr. Then the film was held at 775° C. for another 10 minutes in the process gas containing oxygen partial pressure of about 0.076 Torr and a water vapor pressure of about 5 mTorr. The film was cooled in the same process gas until 450° C. at a rate of approximately 3.5° C./minute. At 450° C., the film was held in the process gas containing 760 Torr oxygen for one hour and then cooled down to room temperature at a rate of approximately 1.5° C./minute.

Figure 4:
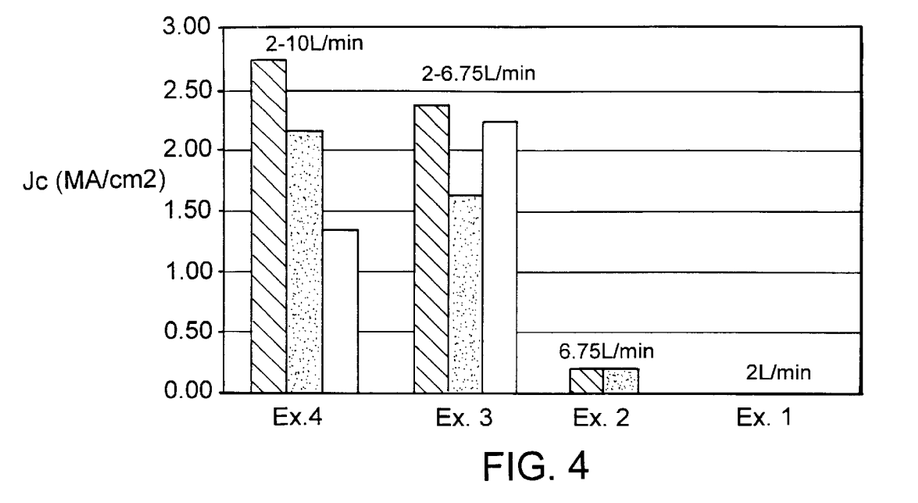
FIG. 4 is a plot of critical current density ($J_c$) of superconducting films as a function of process gas flow rate during final reaction.

The critical current density of the film prepared according to Comparative Example 1 is displayed graphically in FIG. 4, which shows $J_c$ as a function of process gas flow rate (increasing flow rate corresponds to increased turbulent flow and therefore more disruption of the boundary layer) during the final reaction. Individual bars above each process i.d. number in FIG. 4 represent repeat experiments with the same process conditions. The $J_c$ of this particular sample was about 0.01 $MA/cm^2$ at 77K, self field.

Figure 5:
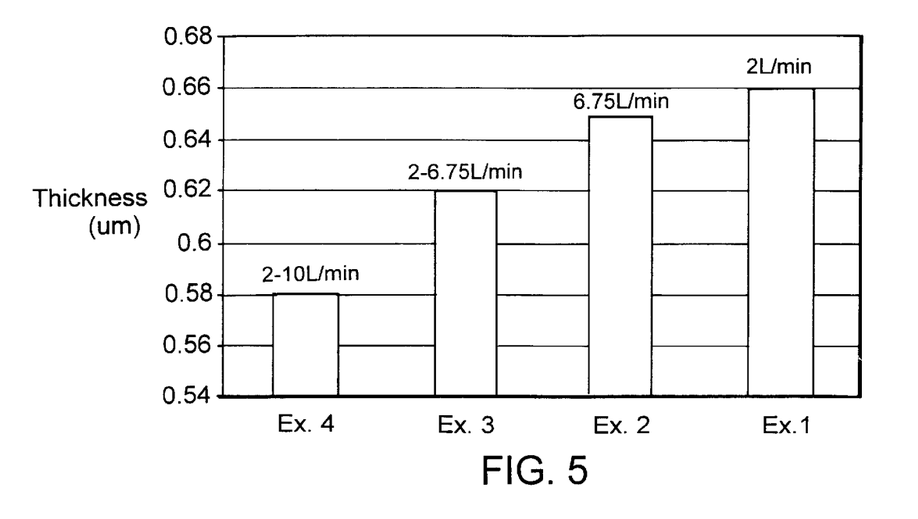
FIG. 5 is a plot of final superconducting film thickness as a function of process gas flow rate.

FIG. 5 shows the thickness of the film as a function of process parameters investigated. All the films have the same oxide coating weight, that is, grams of $YBa_2Cu_3O_{7-x}$ per $m^2$. The thickness of the film prepared according to Comparative Example 1 is displayed graphically in FIG. 5. After reaction, the film was approximately 0.6 µm thick. With the low gas flow (that is, a relatively stable boundary layer at the film/gas interface) throughout the process, the film carried 0.01 $MA/cm^2$ any super current and the texture was poor. This is typical of the process generally used for processing thin films.

Example 2

Jc and Thickness of Films Prepared with 6.75 L/minute Flow Rate

Films were made according to the procedure of Example 1, except that the flow rate of the gas was 6.75 L/minute-throughout the heat treatment, and the reaction time at 775° C. was reduced to 2.5 hours. The critical current density ($J_c$) of the film prepared according to Example 2 is displayed graphically in FIG. 4 and was approximately 0.25 $MA/cm^2$. The film thickness of the film prepared according to Example 2 is displayed graphically in FIG. 5, and was approximately 0.6 microns.

Example 3

$J_c$ and Thickness of Films Prepared with 2–6.75 L/minute Flow Rate

Films were made according to the procedure of Example 1, except that in the final reaction, a process gas flow rate of 2 L/minute was used during the ramp up to 775° C., and then a 6.75 L/minute flow rate was used for the rest of the process, and the reaction time at 775° C. was reduced to 2.5 hours.

The critical current density ($J_c$) of the film prepared according to Example 3 is displayed graphically in FIG. 4, in which the flow values of 2–6.75 L/minute corresponds to a flow rate of 2 L/minute during the temperature ramp, and 6.75 L/minute during "soaking" at the highest temperature. The $J_c$ value of films prepared according to Example 3 was approximately 2 $MA/cm^2$.

As shown in FIG. 5, the decrease of final film thickness with increasing flow rate corresponds to the formation of a denser film. This also contributes to higher $J_c$.

Example 4

$J_c$ and Thickness of Films Prepared with 2–10 L/minute Flow Rate

Films were made according to the procedure of Example 3, except that a 10 L/minute flow rate was used for the portion of the process carried out after the temperature ramp to 775° C.

The critical current density ($J_c$) of the film prepared according to Example 4 is displayed graphically in FIG. 4, in which the flow values of 2–10 L/minute corresponds to a flow rate of 2 L/minute during the temperature ramp, and 10 L/minute during "soaking" at the highest temperature. The Jc value of films prepared according to Example 4 was approximately 2 $MA/cm^2$.

As shown in FIG. 5, the decrease of final film thickness with increasing flow rate corresponds to the formation of an even denser film than in Example 3. With low gas flow during ramping and high gas flow during the constant temperature reaction step, the texture of the film increased along with the film density and critical current density.

ALTERNATE EMBODIMENTS

A number of embodiments of the invention have been described. Nevertheless, it will be understood that various modifications may be made without departing from the spirit and scope of the invention. For example, it should be realized that there are other approaches to carrying out this process of inhibiting the formation of $YBa_2Cu_3O_{7-x}$ until the required reaction conditions are attained. These can include, but are not limited to: 1) controlling the composition of the process gas during processing (for example, $pO_2$ or $pH_2O$), 2) altering the time required to heat the sample to the required temperature; or 3) changing the concentration of the gaseous reactants (for example, $O_2$ and $H_2O$). These approaches, when used in combination with the methods disclosed herein, can be effective in producing superior oxide layers for superconducting, semiconducting, and other applications. Accordingly, other embodiments are within the scope of the following claims.

What is claimed is:

1. A method of forming an oxide superconductor, the method comprising:

providing a composite in a reaction vessel, the composite comprising a metal oxyfluoride intermediate on a surface of a first layer;

heating the reaction vessel to a first temperature while introducing into the reaction vessel a first gas mixture at a first gas flow, rate, the first temperature being less than a process temperature; and heating the reaction vessel at the process temperature while introducing into the reaction vessel a second gas mixture to form the oxide superconductor on the surface of the first layer, the second gas mixture having a second gas flow rate that is different from the first gas flow rates, wherein the first and second gas mixtures and the first and second gas flow rates are selected to control an amount of a reactant delivered to the surface of the composite and an amount of a reaction product removed from the surface of the composite, the reactant being capable of reacting with the metal oxyfluoride intermediate while forming the oxide superconductor, the reaction product is evolved from the composite during formation of the oxide superconductor.

2. The method of claim 1, wherein the first gas flow rate is lower than the second gas flow rate.

3. The method of claim 1, wherein the process temperature is from about 600 to about 850° C.

4. The method of claim 3, wherein the process temperature is from about 650 to about 850° C.

5. The method of claim 4, wherein the process temperature is from about 700 to about 800° C.

6. The method of claim 1, wherein the second gas mixture comprises a gaseous reactant, and the metal oxyfluoride intermediate reacts with the gaseous reactant to form the oxide superconductor.

7. The method of claim 6, wherein the formation of the oxide superconductor proceeds with the generation of a gaseous product.

8. The method of claim 1, further comprising disposing a precursor to the metal oxyfluoride intermediate on the surface of the first layer and treating the precursor to form the metal oxyfluoride intermediate, wherein the precursor comprises soluble compounds of a first metal, a second metal and a rare earth metal.

9. The method of claim 8, wherein the first metal is copper, and the second metal is an alkaline earth metal.

10. The method of claim 9, wherein the precursor comprises copper oxide, barium fluoride and a rare earth oxide.

11. The method of claim 1, wherein the oxide superconductor has a superconducting transition temperature of more than about 77K.

12. The method of claim 1, wherein the oxide superconductor forms a film having a thickness of at least about 0.6 microns.

13. The method of claim 1, wherein the oxide superconductor has a critical current density of at least about $5 \times 10^5$ A/cm$^2$.

14. The method of claim 1, wherein the first layer comprises a substrate.

15. The method of claim 14, wherein the substrate is a biaxially textured metal or metal alloy.

16. The method of claim 15, wherein the substrate is a face centered cubic metal or metal alloy.

17. The method of claim 14, wherein the substrate is a nickel-containing alloy.

18. The method of claim 14, wherein the first layer further comprises a buffer layer disposed on the substrate.

19. The method of claim 18, wherein the buffer layer comprises at least one layer of a metal oxide.

20. The method of claim 19, wherein the metal oxide is cerium oxide.

21. The method of claim 19, wherein the buffer layer further comprises a layer of yttria-stabilized zirconia.

22. The method of claim 1, wherein the second gas mixture comprises water vapor and oxygen.

23. The method of claim 22, wherein the water vapor has a partial pressure of from about 5 to about 150 Torr at ambient temperature.

24. The method of claim 23, wherein the water vapor has a partial pressure of from about 5 to about 100 Torr.

25. The method of claim 24, wherein the water vapor has a partial pressure of from about 10 to about 50 Torr.

26. The method of claim 25, wherein the water vapor has a partial pressure of from about 15 to about 20 Torr.

27. The method of claim 22, wherein the oxygen has a partial pressure of from about 5 mTorr to about 8000 mTorr.

28. The method of claim 27, wherein the oxygen has a partial pressure of from about 5 to about 800 mTorr.

29. The method of claim 28, wherein the oxygen has a partial pressure of from about 5 to about 200 mTorr.

30. The method of claim 29, wherein the oxygen has a partial pressure of from about 5 to about 100 mTorr.

31. The method of claim 30, wherein the oxygen has a partial pressure of from about 50 to about 100 mTorr.

32. A coated conductor article made by the method of claim 1.

33. The method of claim 1, wherein the first gas mixture is the same as the second gas mixture.

34. The method of claim 1, wherein the first gas mixture is the same as the second gas mixture, the first gas flow rate is lower than the second gas flow rate, and the process temperature is from about 600° C. to about 850° C.

35. The method of claim 1, wherein a reaction product is evolved from the composite while forming the oxide superconductor and a rate of removal of the reaction product from a surface of the composite for a first gas flow rate is different for from the rate of removal of the reaction product from the surface of the composite for the second gas flow rate.

36. The method of claim 35, wherein the first and second gas mixtures comprise a reactant that reacts with the metal oxyfluoride intermediate while forming the oxide superconductor, and a rate of delivery of the reactant to the surface of the composite for the first gas flow rate is different from a rate of delivery of the reactant to the surface of the composite for the second gas flow rate.

37. The method of claim 1, wherein the first and second gas mixtures comprise a reactant that reacts with the metal oxyfluoride intermediate while forming the oxide superconductor, and a rate of delivery of the reactant to the surface of the composite for the first gas flow rate is different from a rate of delivery of the reactant to the surface of the composite for the second gas flow rate.

38. The method of claim 37, wherein the reactant is water.

39. The method of claim 38, wherein the reaction product is HF.

40. The method of claim 37, wherein the reaction product is HF.

41. The method of claim 1, wherein the reaction product is HF.

42. A method of forming an oxide superconductor, the method comprising:

providing a composite in a reaction vessel, the composite comprising a metal oxyfluoride intermediate on a surface of a first layer;

heating the reaction vessel to a first temperature while introducing into the reaction vessel a first gas mixture at a first gas flow rate, the first temperature being less than a process temperature; and heating the reaction vessel at the process temperature while introducing into the reaction vessel a second gas mixture to form the oxide superconductor on the surface of the first layer, the second gas mixture having a second gas flow rate that is different from the first gas flow rate, wherein the first and second gas mixtures comprise a reactant that reacts with the metal oxyfluoride intermediate while forming the oxide superconductor, and a rate of delivery of the reactant to a surface of the composite for the first gas flow rate is different from a rate of delivery of the reactant to the surface of the composite for the second gas flow rate.

43. The method of claim 42, wherein the first gas flow rate is lower than the second gas flow rate.

44. The method of claim 42, wherein the first gas mixture is the same as the second gas mixture and the process temperature is from about 600° C. to about 850° C.

45. The method of claim 42, wherein the reactant is water.

46. The method of claim 45, wherein a reaction product is, evolved from the composite while forming the oxide superconductor and a rate of removal of the reaction product from the surface of the composite for a first gas flow rate is different for from a rate of removal of the reaction product from the surface of the composite for the second gas flow rate.

47. The method of claim 46, wherein the reaction product is HF.

* * * * *